United States Patent [19]

Ackerman et al.

[11] Patent Number: 5,181,216
[45] Date of Patent: Jan. 19, 1993

[54] PHOTONICS MODULE APPARATUS

[75] Inventors: David A. Ackerman, Hopewell; Greg E. Blonder, Summit; William M. MacDonald, Stockton, all of N.J.

[73] Assignee: AT&T Bell Laboratories, Murray Hill, N.J.

[21] Appl. No.: 844,018

[22] Filed: Mar. 2, 1992

Related U.S. Application Data

[62] Division of Ser. No. 572,592, Aug. 27, 1990, Pat. No. 5,124,281.

[51] Int. Cl.⁵ .............................................. H01S 3/04
[52] U.S. Cl. ..................................... 372/36; 385/35; 372/108; 257/432
[58] Field of Search ............... 385/35; 372/36, 108; 359/664, 811, 819; 357/19

[56] References Cited

U.S. PATENT DOCUMENTS

| | | | |
|---|---|---|---|
| 4,104,676 | 8/1978 | Bednorz et al. | 357/79 |
| 4,263,702 | 4/1981 | Vig et al. | 29/25.35 |
| 4,670,770 | 6/1987 | Tai | 357/60 |
| 4,914,667 | 4/1990 | Blonder et al. | 372/44 |
| 4,978,189 | 12/1990 | Blonder et al. | 385/35 |

FOREIGN PATENT DOCUMENTS

| | | | |
|---|---|---|---|
| 380396 | 10/1989 | Fed. Rep. of Germany | 385/35 |
| 0096912 | 5/1987 | Japan | 385/35 |

OTHER PUBLICATIONS

"The Solid Phase Welding of Metals," by R. F. Tylecote, New York St. Martin's Press, 1968, pp. 187-224.
Gower A. Kennedy, "Introduction to Welding," Welding Technology, Howard W. Sams & Co., Inc., 1974, p. 15.

Primary Examiner—James W. Davie
Attorney, Agent, or Firm—R. B. Anderson

[57] ABSTRACT

A laser (15) is mounted on a planar surface of a monocrystalline silicon mounting member (12). A spherical lens (20) is mounted in a monocrystalline silicon cover member (13) which, when abutted and registered to the mounting member (12), aligns the spherical lens with the laser so that the output light can be projected along a precise predetermined path. The spherical lens (20) is mounted in a first V-shaped groove (31) which is made in the cover member by masking and etching. A second V-shaped groove intersects the first groove and defines a V-shaped edge in one side of the first groove. The spherical lens is then seated in the first V-shaped groove such that it bears against two points of the V-shaped edge and against one side wall (35) of the first V-shaped groove. A second lens (19) is mounted in the cover member in the same manner as the first lens and directs laser light from a rear facet of the laser to a mirror 30 and hence to a photodetector (21) mounted in the cover member.

7 Claims, 3 Drawing Sheets

PHOTONICS MODULE APPARATUS

This is a division of application Ser. No. 07/572,592 filed Aug. 27, 1990, now U.S. Pat. No. 5,124,281.

TECHNICAL FIELD

This invention relates to photonics modules and, more particularly, to methods for making such modules with a high degree of precision.

BACKGROUND OF THE INVENTION

Optical communications systems are widely used for carrying very large quantities of information with low distortion and at low cost over great distances. Optical systems are also promising for such purposes as computing because of the inherently high speed at which they can be operated. For these reasons, considerable development work has been done on components of optical communications systems, such as photonics packages or modules. Photonics generally refers to devices that share both electronic and optical attributes, such as lasers, which generate coherent light in response to an electronic signal, and photodetectors, which generate an electronic signal in response to light.

In making photonics packages such as laser source modules, it is important to make components such as the laser and the laser output lens to be in precise predetermined alignment. Since many such modules are typically required for a system, designs are required that permit mass-production by operators having a moderate level of skill, while maintaining the required alignment criteria.

During the operation of a semiconductor laser source module, in which light is directed from a front facet of the laser through a lens to an output waveguide, it is often desirable to project light emitted from a rear facet of the laser onto a photodetector for monitoring operation of the laser. In providing such a laser source module, lenses on opposite sides of the laser may be provided for projecting light, both toward an output optical waveguide and toward a photodetector, and such lenses must be mounted in precise predetermined alignment or registration with the semiconductor laser. Thus, there is a need in the industry for methods for mass-producing laser source modules with a sufficiently high degree of precision to assure the accurate alignment of a lens with the laser; there is a further need for a module in which lenses are accurately aligned with the laser on opposite sides of the laser.

SUMMARY OF THE INVENTION

In accordance with one embodiment of the invention, a laser is mounted on a planar surface of a monocrystalline silicon mounting member. A spherical lens is mounted in a monocrystalline silicon cover member which, when abutted against the mounting member, aligns the spherical lens with the laser in the direction normal to the planar surface of the mounting members so that output light can be projected along a precise predetermined path. The spherical lens is mounted in a first V-shaped groove which is made in the cover member by masking and etching. A second V-shaped groove intersects the first groove and defines a V-shaped edge in one side of the first groove. The spherical lens is then seated in the first V-shaped groove such that it bears against both edges of the V-shaped edge and against one side wall of the first V-shaped groove. One can control very precisely the width and depth of the grooves, and, consequently, one can control with precision the location of the center of the spherical lens with respect to the surface of the cover member. Abutting and registering the cover member with respect to the mounting member thereby aligns the spherical lens with respect to the laser. A cavity in the cover member receives the protruding laser so as to permit abutment of the cover member with the mounting member.

As pointed out above, semiconductor lasers characteristically emit light from opposite facets, and it is convenient to collect light from one facet of the laser to use for monitoring purposes. In accordance with the invention, a second spherical lens is mounted in the cover member by the same general method that was used for the first spherical lens. The V-shaped grooves are of somewhat different dimension, however, so as to displace the center of the second spherical lens from the optical axis defined by the laser. A reflecting surface is made in the mounting member by mask and etch techniques, and a photodetector is mounted in the cover member. The displaced second spherical lens is positioned to direct laser light to the reflecting surface, which in turn directs it toward the photodetector.

As will be clear from the detailed description, the invention permits the assembly of elements to extremely close tolerances by relatively unskilled operators in a manner that is consistent with, and amenable to, mass production. These and other objects, features and benefits of the invention will be better understood from a consideration of the following detailed description taken in conjunction with the accompanying drawing.

DETAILED DESCRIPTION

Figure 1:
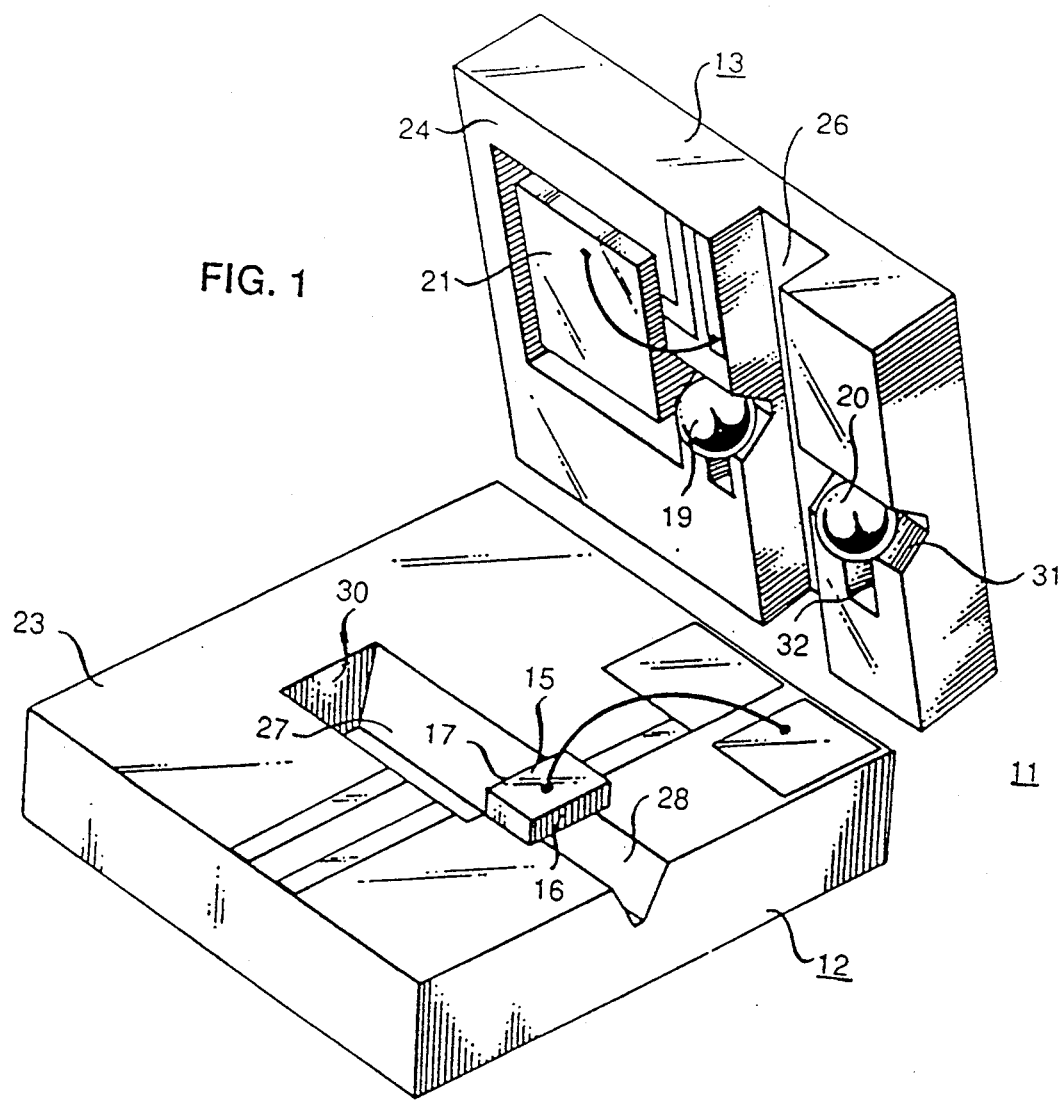
FIG. 1 is a schematic perspective view of components of a laser module made in accordance with an illustrative embodiment of the invention.

Referring now to FIG. 1, there is shown a perspective view of components of a laser module 11 made in accordance with an illustrative embodiment of the invention. The module comprises a monocrystalline silicon laser mounting member 12 and monocrystalline silicon cover member 13. Mounted on the mounting member is a semiconductor laser 15 which is adapted to emit light from both a front facet 16 and a rear facet 17. Mounted within indentations in the cover member 13 are spherical ball lenses 19 and 20 and a semiconductor photodetector 21.

Both the mounting member 12 and the cover member 13 are made of <100> silicon having opposite surfaces 23 and 24 which are both <100> crystallographic surfaces. The laser module is assembled by abutting surfaces 23 and 24 and sealing permanently the cover member 13 to the mounting member 12. The cover member includes a cavity 26 for receiving the laser 15 during assembly, while the mounting member includes cavities 27 and 28 for respectively receiving spherical lenses 19 and 20. One end of cavity 27 is located on a <111> plane and is metallized to constitute a mirror 30. During operation, electrical energy is applied to laser 15 to cause it to emit light simultaneously from facets 16 and 17. Ball lens 20 projects light from front facet 16 onto a waveguide such as an optical fiber (not shown) for subsequent utilization, while spherical lens 19 projects rear facet light against the mirror 30, which in turn projects it onto the photodetector 21. As is known, it is convenient to incorporate a photodetector in a laser source module for monitoring the output of the laser during its operation.

Figure 2:
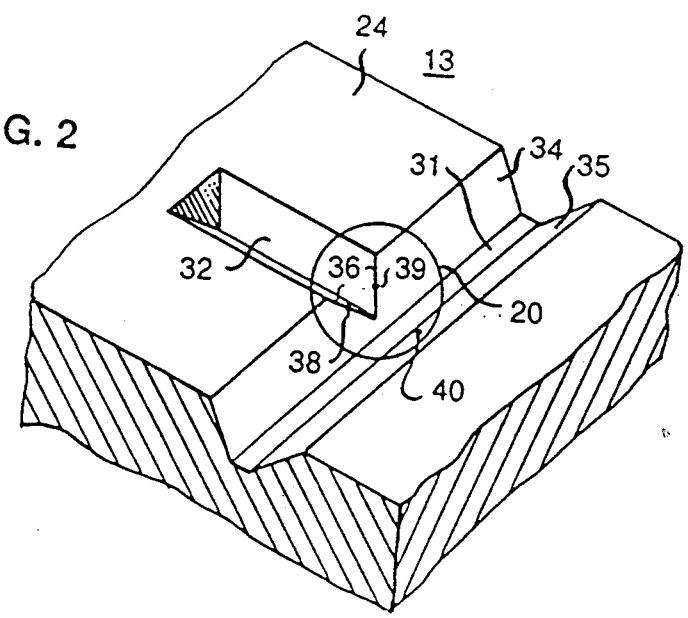
FIG. 2 is a schematic perspective view of part of the cover plate of the apparatus of FIG. 1.

In accordance with one embodiment of the invention, the spherical lenses 19 and 20 are each mounted in a V-shaped groove in the cover plate 13 which is intersected by another V-shaped groove. For example, spherical lens 20 is mounted in a V-shaped groove 31 which is intersected by another V-shaped groove 32. As shown in greater detail in the schematic sectional view of FIG. 2, V-shaped groove 31 has opposite side walls 34 and 35. V-shaped groove 32 creates a V-shaped edge 36 at its intersection with the side wall 34. The spherical lens 20 is precisely positioned with respect to cover member 13 by locating it in V-shaped groove 31 such that it bears against the V-shaped edge 36. When so seated, it will contact the V-shaped edge 36 at two points 38 and 39, and it will bear against side wall 35 at point 40. These three points of contact, 38, 39 and 40, provide a stable and easily located mounting tripod for the spherical lens 20. It can be appreciated that a relatively unskilled worker can easily locate the spherical lens in this manner with accuracy and secure it to the cover member 13 by epoxy or other appropriate adhesive.

The grooves 31 and 32 are preferably made by masking and anisotropic etching from the surface 24 of the cover member 13. As is known, the side walls 34 and 35 of groove 31 and the side walls of groove 32 will then lie on <111> crystallographic planes. More importantly, because photolithographic masking and etching of monocrystalline silicon is well developed, due to its widespread use in the silicon integrated circuit technology, one can make the V-shaped grooves with accuracies that are within the micron or even submicron range. It is apparent that the location of the center of sphere 20 with respect to the surface 24 of member 13 is a function of the dimensions of grooves 31 and 32. Thus, the location, in three dimensions, of the spherical lens can be reproduced with the same accuracy as that of the grooves 31 and 32. The geometrical relationships of the center of the spherical lens 20 with respect to the surface 24 and the parameters of the grooves 31 and 32 are matters within the skill of a worker in the art but, nevertheless, these geometrical relationships are mathematically derived in an appendix attached hereto. As is known, an anisotropically etched V-shaped groove may have opposite sloping side surfaces connected by a flat bottom surface, and the term "V-shaped" is intended to embrace such a configuration.

Referring to FIG. 1, laser 15 is mounted on mounting member 12 such that its emitting junction is at a precisely predetermined location with respect to the upper surface 23 of the mounting member. Thus, when surface 24 of the cover member is abutted with surface member 23 during assembly, the location of spherical lens 20 is fixed with respect to the location of the emitting junction of the laser in the direction normal to surface 23.

Figure 3:
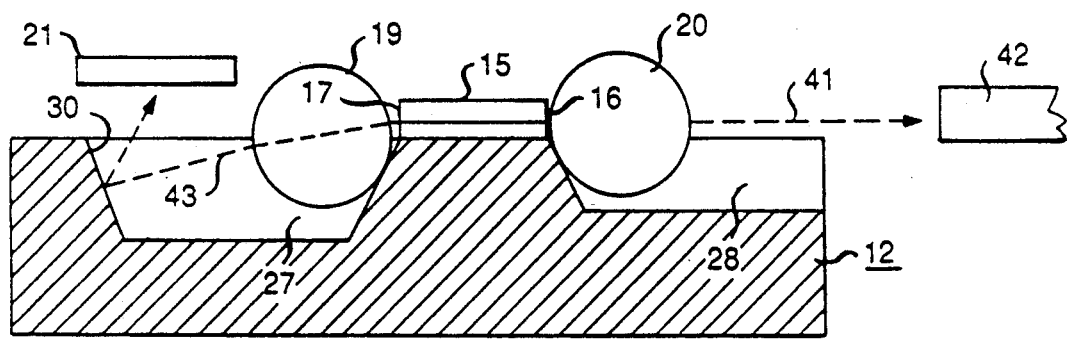
FIG. 3 is a schematic sectional view of part of the laser module of FIG. 1.

Referring to FIG. 3, which shows the locations of the spherical lenses 19 and 20 after the cover member 13 (not shown in FIG. 3) has been fixed to mounting member 12, it is typically desired that the center of ball lens 20 be at the same height as the emitting junction of laser 15. This will cause light emitted from the front facet 16 to be projected along a path 41 which is substantially colinear with the emitting junction. The ball lens 20 focuses the light typically onto an optical fiber 42 which may be part of an optical communications system.

The center of the spherical lens 19, on the other hand, is typically displaced downwardly from the emitting junction of the laser 15. Thus, light from the rear side 17 of the laser is deflected downwardly to follow a path 43 that can be efficiently reflected by mirror 30 onto photodetector 21. For purposes of clarity, the details of the cover member 13 are not shown in FIG. 3. The spherical lens 19 is mounted in the cover member 13 by the same general principles depicted in FIG. 2. That is, the location, in three dimensions, of the ball lens 19 is controlled by the location and dimensions of intersecting V-shaped grooves, which, for the reasons given before, can be made in the silicon crystal with great accuracy. The configurations of cavity 26 in cover member 13 as shown in FIG. 1 and the cavity for holding the photodetector 21 do not have critical dimensions, and can therefore be made in any way that seems most appropriate. For example, cavity 26 is preferably made by sawing.

The details of the formation of conductors and the like for operating the laser and photodetector are matters within the skill of the worker in the art, and for the sake of brevity have not been described. The thickness of such conductors is typically less than a micron, and therefore does not interfere with the registration of the cover member with the laser mounting member. The manner in which the electrical output of the photodetector is used to monitor the operation of the laser is likewise not described, for the sake of brevity.

The cover member 13 is typically bonded to the mounting member 12 by soldering in a manner that is well known in the art and is done in such a way as to precisely register the surface 24 with the surface 23. It is particularly convenient to include matching metallized V-grooves (not shown) in the surfaces 23 and 24 to contain solder which, after alignment, is melted or reflowed to effect a bond. Lateral alignment can be made "actively," that is, by detecting laser light projected through spherical lens 20 and moving the cover member 13 laterally with respect to mounting member 12 until light projection along the preferred path is obtained. Alternatively, indexing projections and receptacles can be made for giving mechanical lateral registration of the cover member on the mounting member with resultant lateral alignment of the lens 20 with the laser. However, with this option, care would have to be taken in properly aligning the laser when bonding it to the mounting member 12. The cover and mounting members can optionally be bonded by allowing liquid epoxy or other adhesive to wick, or move by capillary action, between the two members after alignment.

Referring to FIG. 1, semiconductor laser 15 is preferably mounted "active side down"; that is, the side of the semiconductor body in which the emitting junction is formed is bonded to mounting member 12. By mounting the laser in this manner, the position of the emitting junction can be referenced with respect to surface 23 of the mounting member with great accuracy. Ordinarily, mounting in this manner would complicate the problem of positioning and accurately aligning the ball lens since the emitting junction is displaced from the surface of mounting member 12 by a distance of typically only three microns. Specifically, we have found no alternative way of accurately seating the ball lenses in the cover plates so that they are sufficiently close to the facets 16 and 17 while avoiding light beam obstruction. For many applications, particularly where the light is to be collimated, the ball lens must be within twenty microns of the laser facet. The invention permits such mounting with accurate placement in both the axial and lateral directions, with close proximity to the laser facet, and without beam obstruction. Note that after assembly, grooves 28 and 31 together constitute a channel for light beam transmission.

Figure 4:
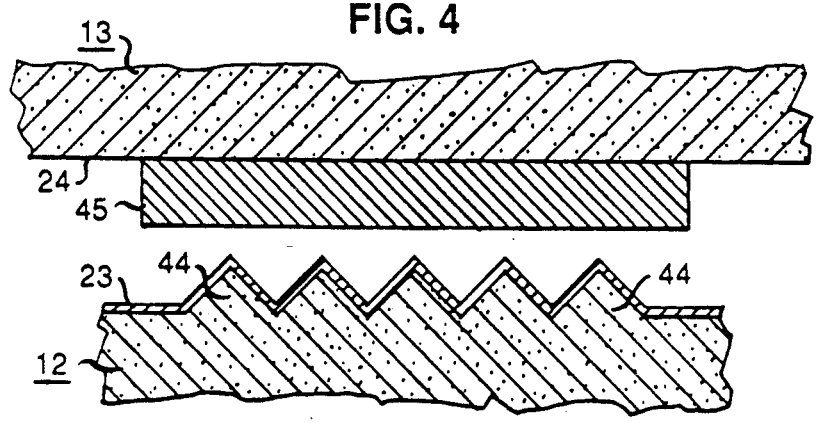
FIG. 4 is a schematic sectional view of an attachment mechanism that may be used in the apparatus of FIG. 1.

The U.S. Pat. No. 4,937,653, of Blonder et al., granted Jun. 26, 1990, which is hereby incorporated by reference herein, shows a method of fastening together two silicon elements by the process depicted in FIG. 4; this process can optionally be used to join the cover member 13 to the mounting member 14. In accordance with this method, an array of triangular projections 44 are made with extremely high tolerance by photolithographic masking and etching. This surface is metallized to make a textured bonding pad and a matching metal bonding pad 45 in the cover member 13. A downward force on the cover member 13 cause the triangular projections 44 to penetrate into the metal pad 45. In accordance with the principle of textured cold welding, high concentrations of force are produced at the tips of projections 44 to produce a localized cold weld at the tip of each projection. When bonding is made in this manner, the relative locations of surfaces 23 and 24 can be made to be accurately predictable. The surfaces of triangular projections 44 are preferably formed by anisotropic etching to lie on crystallographic planes, and can therefore be made with great accuracy. The opposing surfaces may contain several bonding pads, and either bonding pad is textured to have a feature size of between 0.1 and ten microns. Illustratively each triangular projection 44 has a height of five microns. Alternatively, the projections may be made from a native oxide coating on the silicon.

Referring again to FIGS. 1 and 3, the laser 15 may be mounted by textured cold welding in the manner described in the U.S. Pat. No. 5,023,881, of Ackerman et al., granted Jun. 11, 1991, hereby incorporated herein by reference. The laser may be indium phosphide which in accordance with the Ackerman et al. application may be efficiently heat sunk to the mounting member by a relatively massive solder member (not shown).

The cavities 27 and 28 of FIG. 3 are preferably made by masking and etching, leading to the structure shown. The spherical lenses 19 and 20 may bear against the cavity side walls as shown in FIG. 3 or may be slightly displaced from them, since they are supported by their bond to the cover member 13 of FIG. 1.

After the cover member and mounting member have been bonded, the module is preferably located in a hermetically-sealed package (not shown) having a quartz window. Thereafter, the output optical fiber, shown schematically as 42 in FIG. 3, is aligned "actively"; that is, laser light is projected through the window to the fiber, the optical fiber position is adjusted as light is transmitted through the fiber, and after alignment is manifested by maximum light transmission through the fiber, the fiber is fixed to the hermetically-sealed package.

In principle, the method that we have described for accurately locating a spherical lens through the use of intersection V-shaped grooves may be used in devices other than those specifically shown and described. One can appreciate that in the laser module that has been described, it is possible to mount two spherical lenses at different heights with a great deal of accuracy on opposite sides of a laser. The various steps can be reproduced with great accuracy and are therefore well suited for mass-production. In particular, the invention exploits the capabilities of photolithographic masking and anisotropic etching, which have been well developed in the silicon integrated circuit art. Various other embodiments and modifications may be made by those skilled in the art without departing from the spirit and scope of the invention.

APPENDIX

Figure 5:
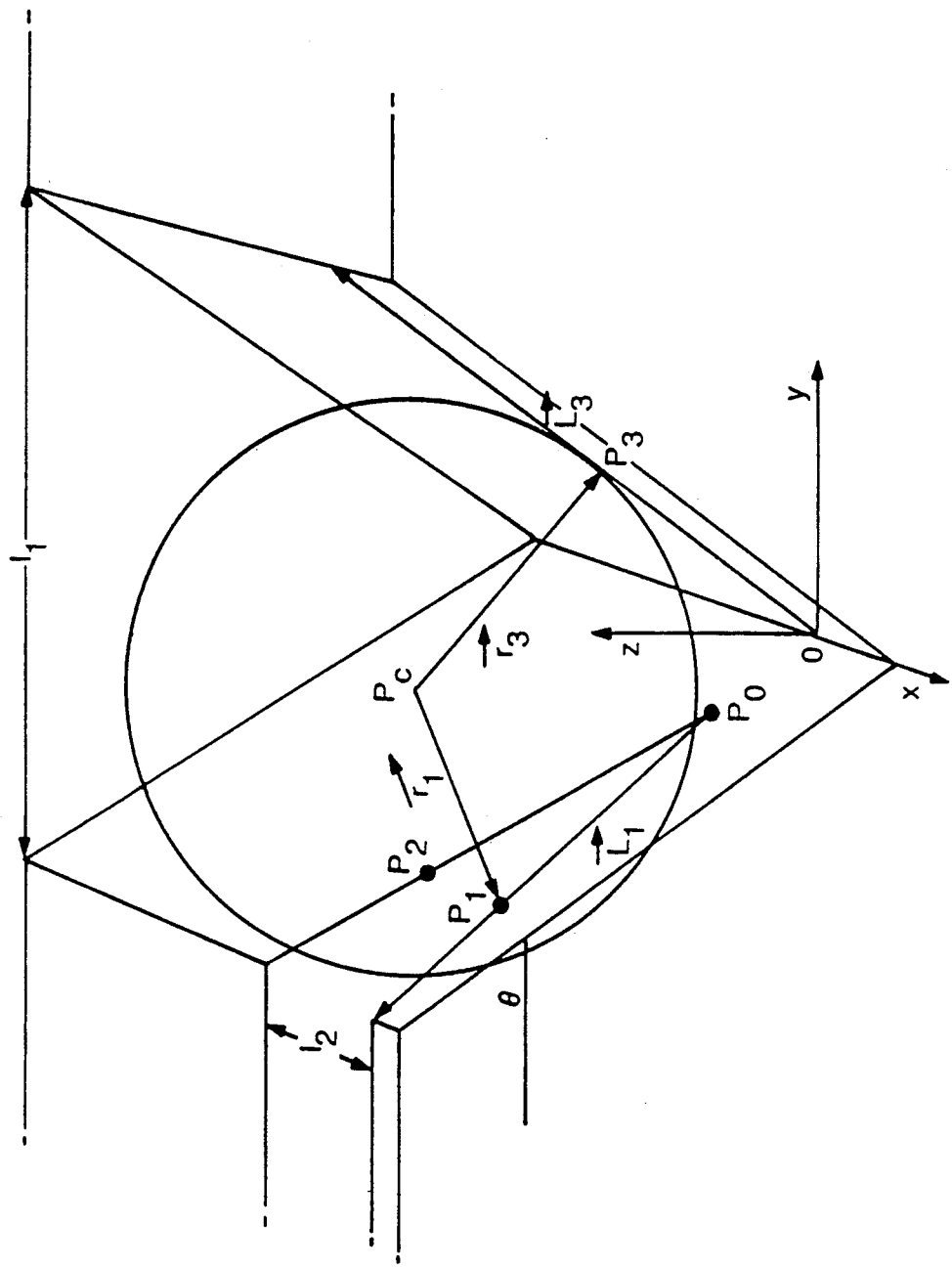
FIG. 5 is a schematic view illustrating the mounting of a spherical lens in accordance with the embodiment of FIG. 1.

In this appendix, a calculation of the position of a sphere placed at the intersection of two V-grooves is described. Referring to FIG. 5, the linewidths of the two V-grooves are $l_1$ (the larger linewidth) and $l_2$ (the smaller) and the sphere has a radius r. The position of the center of the sphere is given by the point $P_c$ and surface of the sphere makes contact with the silicon at three points $P_1$, $P_2$, and $P_3$.

The choice of origin O, as shown, makes the points $P_1$ and $P_2$ degenerate. The point $P_1$ lies on the segment $\overline{P_0P_1}$, which defines the line of intersection of the two $<111>$ planes. The vector $\vec{L}_1$ is parallel to line segment $\overline{P_0P_1}$. The point $P_3$ lies on line segment $\overline{P_0P_3}$, on the $<111>$ plane of the larger V-groove. Vector $\vec{L}_3$ is parallel to line segment $\overline{P_0P_3}$.

The constraints that the sphere make contact at three points together with the descriptions of the lines that contains these points result in a system of nine equations and nine unknowns from which the position of the center of the sphere can be determined, given the linewidths of the V-grooves and the radius of the sphere. In what follows, the constraints and line parameters will be given along with the resulting quadratic equation which determines the z-position of the center of the sphere.

The constraint that line segment $\overline{P_0P_1}$ is tangent to the sphere is expressed by:

$$\vec{L}_1 \cdot \vec{r}_1 = 0 \qquad (1)$$

where $x\vec{r}_1 = (x_1, y_1 - y_c, z_1 - z_c)$ is the vector from $P_c = (x_c, y_c, z_c)$ to $P_1 = (x_1, y_1, z_1)$. The constraint that line segment $P_0P_3$ is tangent to the sphere is represented by:

$$\vec{L}_3 \cdot \vec{r}_3 = 0 \qquad (2)$$

where $\vec{r}_3 = (0, y_3 - y_c, z_3 - z_c)$ is the vector from $P_c$ to $P_3$. The points $P_1$ and $P_3$ are constrained to lie on the surface of a sphere centered at $P_c = (x_c, y_c, z_c)$. This constraint gives two more equations:

$$(y_3 - y_c)^2 + (z_3 - z_c)^2 = r^2 \qquad (3)$$

$$x_1^2 + (y_1 - y_c)^2 (z_1 - z_c)^2 = r^2. \qquad (4)$$

The parameterization of the line segment $\overline{P_0P_1}$ gives:

$$\lambda_1 = ax_1 \qquad (5)$$

$$\lambda_1 = a\left(y_1 + \left(\frac{l_1}{2} - \frac{l_2}{2}\right)\right) \tag{6}$$

$$\lambda_1 = \frac{a}{\tan(\theta)}\left(z_1 - \left(\frac{l_1}{2} - \frac{l_2}{2}\right)\tan(\theta)\right) \tag{7}$$

where $a = \sqrt{2 + \tan^2(\theta)}$. The parameterization of $\overline{P_0P_3}$ gives $$\lambda_2 = y_3 \sin(\theta) \tag{8}$$

$$\lambda_2 = z_3 \cos(\theta). \tag{9}$$

This system of nine unknowns ($x_1$, $y_1$, $z_1$, $y_c$, $z_c$, $y_3$, $z_3$, $\lambda_1$, and $\lambda_2$) and the nine equations above can be solved for the position of the z-coordinate of the center of the sphere. The solution is a quadratic equation:

$$Az_c^2 + Bz_c + C = 0 \tag{10}$$

where $$A = \frac{-b^2}{a} + \frac{1}{\sin^2(\theta)} \tag{11}$$

$$B = -2\left(\frac{cb}{a} + \frac{r}{\sin(\theta)\tan(\theta)}\right) \tag{12}$$

$$C = \left(\frac{l_1}{2} - \frac{l_2}{2}\right)^2 - \frac{c^2}{a} + \left(\frac{r}{\sin(\theta)}\right)^2 - r^2 \tag{13}$$

where $$b = 1 - \frac{\tan^2(\theta)}{\tan(\theta)} \text{ and} \tag{14}$$

$$c = -\frac{r}{\sin(\theta)} - \left(\frac{l_1}{2} - \frac{l_2}{2}\right). \tag{15}$$

From $z_c, y_c$ can be obtained from an intermediate step.

We claim:
1. An optical device comprising:
    a first member having in a first surface thereof a first V-shaped groove having first and second side walls;
    a second V-shaped groove in said first surface which intersects said first groove and defines a first V-shaped edge in the first side wall of said first groove;
    a spherical lens seated in said first groove such that it bears against two points of said first V-shaped edge and against one point of the second side wall of said first V-shaped groove, said spherical lens being permanently bonded within said first groove.
2. The optical device of claim 1 further comprising:
    a photonic device mounted on a second member so as to be in a predetermined relationship with a first surface of the second member;
    said first surface of said first member being abutted against a first surface of said second member, said first and second members being permanently bonded;
    said photonic device extending into a cavity in said first member.
3. The optical device of claim 2 wherein:
    the photonic device is a laser;
    a mirror is defined in said second member;
    and a photodetector is mounted within a cavity in said first member and adapted to receive laser light reflected from said mirror.
4. The optical device of claim 3 further comprising:
    a third V-shaped groove having first and second side walls in said first surface of said first member;
    a fourth V-shaped groove in said first surface of the first member intersecting the third groove and defining a second V-shaped edge in said first side wall of said third groove;
    a second spherical lens being seated in said third groove such that it bears against two points of said second V-shaped edge and against said second wide wall of said third V-shaped groove and is bonded within said third V-shaped groove.
5. The optical device of claim 4 wherein:
    said second lens is positioned with respect to said laser so as to direct laser light to said photodetector by way of said mirror.
6. The device of claim 4 wherein:
    said first and second members are monocrystalline silicon;
    said first and second surfaces are <100> surfaces and said side walls of said V-shaped grooves and the mirror are <111> surfaces.
7. The device of claim 3 wherein:
    said first member includes on a first surface at least one first bonding pad and the second member includes at least one second bonding pad;
    the first or second bonding pad, or both, are textured, the texturing having a feature size of between 0.1 and ten microns;
    the textured features of one bonding pad being texture cold welded to the other bonding pad.

* * * * *